(12) United States Patent
Du

(10) Patent No.: US 11,424,376 B2
(45) Date of Patent: Aug. 23, 2022

(54) SUPERLATTICE ABSORBER FOR DETECTOR

(71) Applicant: Peng Du, Beijing (CN)

(72) Inventor: Peng Du, Beijing (CN)

( * ) Notice: Subject to any disclaimer, the term of this patent is extended or adjusted under 35 U.S.C. 154(b) by 0 days.

(21) Appl. No.: 16/758,713

(22) PCT Filed: Apr. 9, 2019

(86) PCT No.: PCT/CN2019/081971
§ 371 (c)(1),
(2) Date: Apr. 23, 2020

(87) PCT Pub. No.: WO2020/206621
PCT Pub. Date: Oct. 15, 2020

(65) Prior Publication Data
US 2022/0052213 A1 Feb. 17, 2022

(51) Int. Cl.
*H01L 31/0352* (2006.01)
*H01L 31/0304* (2006.01)

(52) U.S. Cl.
CPC ........ *H01L 31/035236* (2013.01); *H01L 31/03046* (2013.01)

(58) Field of Classification Search
None
See application file for complete search history.

(56) References Cited

U.S. PATENT DOCUMENTS

| 5,995,529 | A | 11/1999 | Kurtz et al. | |
|---|---|---|---|---|
| 6,369,436 | B1* | 4/2002 | Gilman | H01L 31/0236 257/184 |
| 7,682,865 | B2 | 3/2010 | Razeghi | |
| 8,928,036 | B2* | 1/2015 | Ting | H01L 31/0352 257/184 |
| 2002/0027238 | A1* | 3/2002 | Lin | B82Y 20/00 257/292 |
| 2011/0037097 | A1* | 2/2011 | Scott | B82Y 20/00 257/184 |
| 2012/0145996 | A1* | 6/2012 | Ting | H01L 31/101 257/21 |

(Continued)

FOREIGN PATENT DOCUMENTS

| CN | 102176489 A | 9/2011 |
|---|---|---|
| CN | 102534764 A | 7/2012 |

(Continued)

OTHER PUBLICATIONS

"Enhancing optical characteristics of InAs/InGaAsSb quantum dot structures with long-excited state emission at 1.31 μm" by Liu et al. (Year: 2014).*

(Continued)

*Primary Examiner* — Evren Seven
(74) *Attorney, Agent, or Firm* — Panitch Schwarze Belisario & Nadel LLP

(57) ABSTRACT

A superlattice absorber for a detector is provided. The superlattice absorber includes a plurality of material periods deposited successively. Each of the material periods includes a first layer of InAs, InGaAs, InAsSb or InGaAsSb; and a plurality of second layers of InGaAsSb. The second layers comprise at least two InGaAsSb layers with at least two different content combinations. The content of the second layers is different from that of the first layer.

12 Claims, 7 Drawing Sheets

(56) References Cited

U.S. PATENT DOCUMENTS

| | | | |
|---|---|---|---|
| 2016/0005895 A1* | 1/2016 | Yang | H01L 31/03046 257/12 |
| 2016/0259059 A1* | 9/2016 | Mohseni | G02F 1/01725 |
| 2018/0294309 A1* | 10/2018 | Wei | H01L 27/14649 |
| 2019/0355857 A1* | 11/2019 | Fuyuki | H01L 31/109 |

FOREIGN PATENT DOCUMENTS

| | | | |
|---|---|---|---|
| CN | 102569484 A | 7/2012 | |
| CN | 102569521 A | 7/2012 | |
| CN | 103165727 A | 6/2013 | |
| CN | 107430294 A | 12/2017 | |
| JP | 2018113407 A * | 7/2018 | H01S 5/0206 |

OTHER PUBLICATIONS

"Mid-infrared emission from In(Ga)Sb layers on InAs(Sb)" by Liu et al. (Year: 2014).*

"High performance short period superlattice digital alloy InSb/ GaxIn1-xSb laser emitting at 1.9 μm" (Year: 2007).*

Int'l Search Report dated Dec. 30, 2019 in Int'l Application No. PCT/CN2019/081971.

* cited by examiner

SUPERLATTICE ABSORBER FOR DETECTOR

CROSS-REFERENCE TO RELATED APPLICATION

This application is a Section 371 of International Application No. PCT/CN2019/081971, filed Apr. 9, 2019, which has not yet published, the disclosure of which is incorporated herein by reference.

TECHNICAL FIELD

The present application relates in general to photodetectors, and in particular to an absorber of infrared photodetectors.

BACKGROUND

Type II broken bandgap superlattice detector has been intensely studied recent years. An infrared detector normally has an absorber layer to absorb infrared radiation and a contact layer to make contact with a metal electrode. Other functional layers such as a barrier layer and an etch stop layer can be also inserted into the epitaxy structure. The absorber of the detector can be doped to n-type conductivity, p-type conductivity or partly n-type conductivity and partly p-type conductivity. The absorber is the most sensitive part of the detector. The performance of the detector highly depends on the opto-electric property of the absorber material. The absorber material which has a high absorption coefficient and a long carrier lifetime is always preferred in the device. Mercury cadmium telluride (MCT) and Indium antimonide (InSb) are used to be the most popular absorber material for infrared detectors. MCT has a tunable bandgap covering a range from middle infrared wavelength to very long infrared wavelength. InSb is mainly for middle wavelength detection. Broken bandgap InAs/Ga(In)Sb superlattice was proposed because in theory it is a material system which can provide longer minority carrier lifetime than MCT while have a similar absorption coefficient. It is also very flexible to tune the sensitive wavelength from 2 μm-32 μm covering the most interested infrared radiation range.

A superlattice is a periodic structure of layers of two materials. Typically, the thickness of one layer is several nanometers. If the superlattice is made of two semiconductor materials with different band gaps, each quantum well sets up new selection rules that affect the conditions for charges to flow through the structure. The two different semiconductor materials are deposited alternately on each other to form a periodic structure in the growth direction. In the case of InAs/Ga(In)Sb superlattice, these two materials are particular referred to InAs and Ga(In)Sb.

There are other 6.1 Å antimonide based materials proposed for the absorption material. Most effort on Type II detector has been put in the InAs/Ga(In)Sb based superlattice structure and InAs/InAsSb based superlattice structure as the absorber. InAs/Ga(In)Sb superlattice was predicted to have longer minority carrier lifetime than the traditional infrared material MCT. However, due to the Ga related defect, this long minority carrier lifetime hasn't been realized. InAs/InAsSb superlattice was proposed to be the absorber material since there is no Ga in the structure. This 'Ga-free' superlattice was proved to have longer minority carrier lifetime but due to the bigger period thickness of the structure the envelope functions of electron and hole were weaken so that the quantum efficiency was greatly reduced.

Recently, a new type of superlattice structure InGaAs/InAsSb has been proposed to have both long minority carrier lifetime and high quantum efficiency in a middle wavelength range.

In the InAs/GaInSb superlattice, the indium/gallium content and the thickness of the InAs and GaSb layer can be tuned to reach a specified cut off wavelength. These parameters also change the effective mass, residual strain, overlap of the envelope functions of electron and hole etc. So, the combination of these parameters can be changed to optimize the performance of the detector. It is the same situation of InAs/InAsSb superlattice. The As content of the InAsSb layer and thickness of InAs and InAsSb layer can be tuned to optimize the detector.

Those two materials in these traditional superlattice structures to form superlattice always keep their bandgap and lattice constant in the layer of one period. For example, InAs always keeps the same bandgap and lattice constant in the InAs layer and GaSb always keeps the same bandgap and lattice constant in the GaSb layer. Regarding the structure containing tannery compound such as InGaSb, InGaAs and InAsSb, the content of the element is always kept same. Then, they also keep the same bandgap and lattice constant in the superlattice.

More complexed structure such as InAsSb/InGaAsSb superlattice was proposed in some patents (see, U.S. Pat. Pub. No. US20110037097A1). But the InGaAsSb layer is mainly for strain compensation but not as an absorption material. Or, the InGaAsSb is as an absorption material, and the InAsSb is as a strain compensation. In the second case, the bandgap of InGaAsSb determines the absorption wavelength. The content of these ternary or quaternary materials in one period of the superlattice is kept constant.

SUMMARY

An infrared detector comprises a superlattice absorber with multiple InGaAsSb layer is disclosed for high quantum efficiency and a long carrier lifetime. $In_xGa_{1-x}As_ySb_{1-y}$ with different Indium content X and/or As content Y has different band gap and/or lattice constant. With a certain combination of X and Y, it keeps the same lattice constant, but the bandgap may change. Content grading changes content of every monolayer or every a few monolayers of InGaAsSb. These multiple InGaAsSb layers together with an InAs, InGaAs, InAsSb or another InGaAsSb layer form a period of a superlattice. A certain combination of monolayers of $In_xGa_{1-x}As_ySb_{1-y}$ with different Indium and/or Arsenic content together with the InAs, InGaAs, InAsSb or another InGaAsSb layer provide the superlattice with different bandgap of the miniband, but the whole structure may still lattice match to the GaSb or InAs substrate. Repeating growth of the InGaAsSb layers and the InAs, InGaAs, InAsSb or another InGaAsSb layer forms a superlattice absorber for an infrared detector. The absorber with n-type doping or p-type doping is combined with other functional layers such as a barrier layer or other type doping layer and contact layers to make an infrared detector device.

To further improve the minority carrier lifetime and keep or improve the quantum efficiency, the application is based on $In(Ga)As(Sb)_x$/InGaAsSb superlattice with multiple InGaAsSb layers in each superlattice period.

The present application relates to an absorber material of an infrared detector. The absorber comprises InAs/InGaAsSb superlattice, InGaAs/InGaAsSb superlattice, InAsSb/InGaAsSb or InGaAsSb/InGaAsSb superlattice with multiple InGaAsSb layers. The InGaAsSb part in the superlattice has different content for every 1-10 monolayers. Every 1-10 monolayers has the same bandgap and/or lattice constant while the other part of the InGaAsSb layers has a different bandgap and/or lattice constant. The above mentioned other part may have not only one InGaAsSb content but two or more InGaAsSb contents. Thus a InAs/InGaAsSb superlattice with multiple InGaAsSb layers is formed. The InGaAsSb content herein comprises Indium content and/or Arsenic content in the InGaAsSb layer. The Gallium and Antimony contents are then determined accordingly. A certain combination of monolayers of $In_xGa_{1-x}As_ySb_{1-y}$ with different Indium and/or Arsenic content together with the InAs, InGaAs or InAsSb layer provide the superlattice with different bandgap of the miniband, but the whole structure may still lattice match to the GaSb or InAs substrate. The InAs, InGaAs or InAsSb layer and the multiple graded InGaAsSb layers form one period of the superlattice and they are repeated certain times to from the whole superlattice absorber.

The InGaAsSb content is adjusted at the monolayer level by digital grading or random alloy grading.

One can change/grade the content of an alloy by random alloy grading or digital alloy grading. To do random alloy content change/grading of the Indium content of InGaAsSb, at least two sources at different evaporation rates for In or Ga are needed to make a fast switch. To do random alloy grading of the Arsenic content, the valve position of a valved cracker is needed to be changed or two sources for As or Sb are needed.

The digital-alloy technique has been used to grow ternary or quaternary alloys by molecular beam epitaxy (MBE). This technique overcomes the complicated process of the conventional MBE growth such as change of cell temperature, growth interruption, and additional source cell, etc. For example, InAlGaAs compound can be got digitally by growing short period InAlAs/InGaAs superlattice, and InGaAsSb compound can be got by growing short period InGaAs/InGaSb, InAs/GaSb, InAsSb/GaSb, InAs/InGaSb or InAsSb/GaAsSb superlattice. Digital alloy growth at sub monolayer level means the layer to form the superlattice is less than one monolayer thickness. For example, a half monolayer InAsSb and a half monolayer GaAsSb form one monolayer InGaAsSb. Digital grading is realized by changing the thickness of these two layers in the short period superlattice.

$In_xGa_{1-x}As_ySb_{1-y}$ material has a narrow bandgap. The property of the superlattice depends on the X and Y content and thickness of InGaAsSb and the thickness of InAs, InGaAs or InAsSb layer and/or the Indium content of InGaAs or As content of InAsSb. The graded layer will have X1, Y1, X2, Y2, X3, Y3 . . . and thickness 1, 2, 3 . . . of $In_{x1}Ga_{1-x1}As_{y1}Sb_{1-y1}$, $In_{x2}Ga_{1-x1}As_{y2}Sb_{1-y2}$, $In_{x3}Ga_{1-x3}As_{y3}Sb_{1-y3}$ . . . , and thus there are many parameters to adjust.

The benefits of incorporation of the multiple bandgap graded InGaAsSb layer in each superlattice period are:
1, lower Ga content to reduce the Ga related defects to increase minority carrier lifetime.
2, change electron/hole level while keep the detection wavelength same. To manipulate the alignment of defect level and the forbidden bandgap. So that to increase the minority carrier lifetime.
3, manipulate the period thickness to increase the overlap of envelope functions of the electron and hole to increase the quantum efficiency.
4, manipulate the electron envelope function of an electron to push it into the InGaAsSb region to get more overlap of the envelope functions of the electron and hole. That increases quantum efficiency too.
5, same period thickness can reach very long wavelength even semi-metal.

BRIEF DESCRIPTION OF THE DRAWINGS

The benefits of this application will be further understood by various examples, results of calculation data, figures together with details of the application as following.

FIG. 2 also illustrates the $E(k_{\parallel})$ dispersion of electrons and holes (right).

FIG. 4 also illustrates the $E(k_{\parallel})$ dispersion of electrons and holes (right). Herein, the InGaAsSb content is constant in one period of the superlattice.

FIG. 5 also illustrates the $E(k_{\parallel})$ dispersion of electrons and holes (right). Herein, the InGaAsSb part has two layers with different bandgaps.

FIG. 6 also illustrates the $E(k_{\parallel})$ dispersion of electrons and holes (right). Herein, the InGaAsSb part has two layers with different bandgaps. The designed miniband targets middle wavelength (3-5 μm) detection.

FIG. 7 also illustrates the $E(k_{\parallel})$ dispersion of electrons and holes (right). Herein, the InGaAsSb part has three layers but two bandgaps. That is, one of the three layers has a content, and the other two layers have another content. The designed miniband targets long wavelength (8-14 μm) detection.

FIG. 8 also illustrates the $E(k_{\parallel})$ dispersion of electrons and holes (right). Herein, the InGaAsSb part has three layers but two bandgaps. The designed miniband targets long wavelength (8-14 μm) detection. It has the same period thickness as the structure illustrated in FIG. 7 but different content. The detection wavelength is longer than the structure illustrated FIG. 7.

FIG. 9 also illustrates the $E(k_{\parallel})$ dispersion of electrons and holes (right). Herein, the InGaAsSb part has three layers but two bandgaps. The designed miniband targets very long wavelength detection. It has the same period thickness as the structure illustrated in FIG. 8 but different content. The detection wavelength is longer than the structure illustrated FIG. 8.

FIG. 10 also illustrates the E(k∥) dispersion of electrons and holes (right). Herein, the InGaAsSb part has three layers but two bandgaps. It has the same period thickness as the structure illustrated in FIG. 8 but different content. The bandgap of the miniband has disappeared, so it reaches the semimetal range.

FIG. 11 also illustrates the E(k∥) dispersion of electrons and holes (right). Herein, the InGaAsSb part has three layers but two bandgaps. The designed miniband targets long wavelength (8-14 μm) detection. The alignment is different from the structure illustrated in FIG. 7 but has a similar detection bandgap of the miniband.

DETAILED DESCRIPTION

Figure 1:
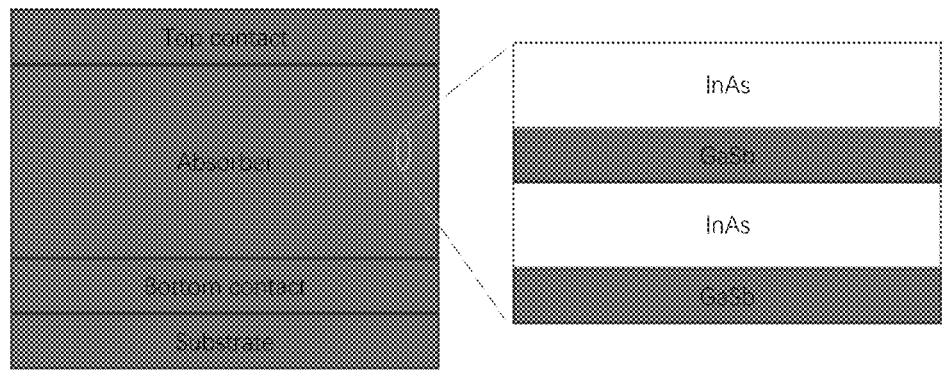
FIG. 1 illustrates a typical device structure of a Type II superlattice structure.
Figure 2:
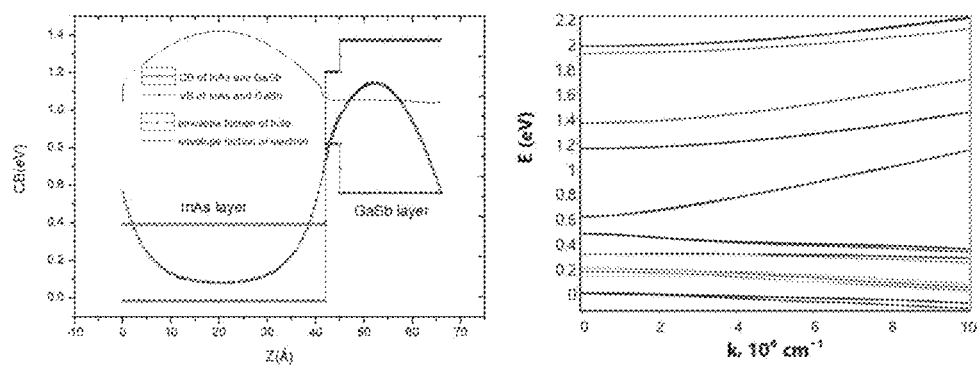
FIG. 2 illustrates the band alignment of one example of InAs/GaSb superlattice with InSb interface together with the envelope functions of electron and hole.

Type II broken bandgap detector was predicted to have more superior performance than MCT and InSb detector. The Valence Band Maximum (VBM) energy level of GaSb is higher than the Conduction Band Minimum (CBM) energy level of InAs which is called 'broken bandgap' alignment. The band gap of miniband depends on the thickness of those two layers. In the case of InGaSb/InAs, it also depends on the indium content, while the indium content also changes the lattice constant. Additional effort needs to be made for the strain compensation. FIG. 1 illustrates a typical structure of a type II detector. The absorber material is InAs/GaSb superlattice. FIG. 2 shows the bandgap alignment of the InAs (13 ML)/GaSb (7 ML) superlattice with InSb interface and the envelope functions of electron and hole. The electron and hole are mainly separate in InAs layer and GaSb layer. The opto-eclectic transition is separated in space. FIG. 2 (right) shows the E(k∥) dispersion of this superlattice. The mini bandgap is about 0.12 eV which has a cut off wavelength of about 10 μm.

Figure 3:
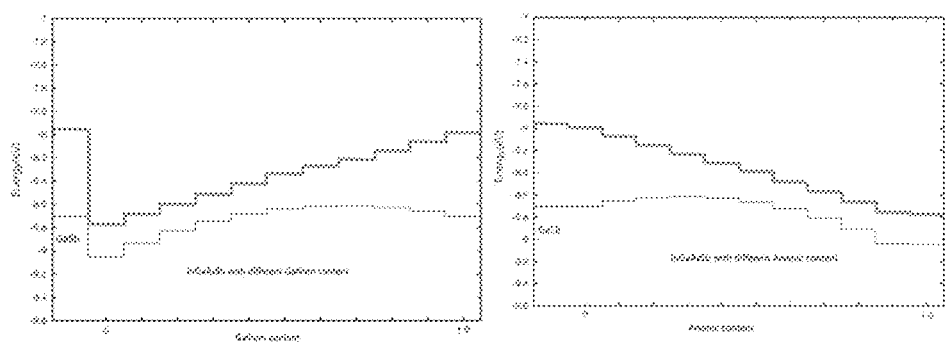
FIG. 3 illustrates composition dependence of the band alignments for the alloy $In_xGa_{1-x}As_ySb_{1-y}$ lattice matched to GaSb with respect to the composition x and the composition y. The solid (thick) and dashed (thin) lines represent the calculated Valence Band Maximum (VBM) and Conduction Band Minimum (CBM) energy levels, respectively.

FIG. 3 shows that the $In_xGa_{1-x}As_ySb_{1-y}$ VBM and CBM change with respect to gallium content and Arsenic content but keep the lattice constant matching to GaSb. It can be seen that the InGaAsSb can have also broken bandgap alignment with InAs, InGaAs or InAsSb when the Gallium content is about higher than 20%. So, InGaAsSb/In(Ga)As superlattice can reach long wavelength detection with short superlattice period. A short superlattice period provides high quantum efficiency.

Figure 4:
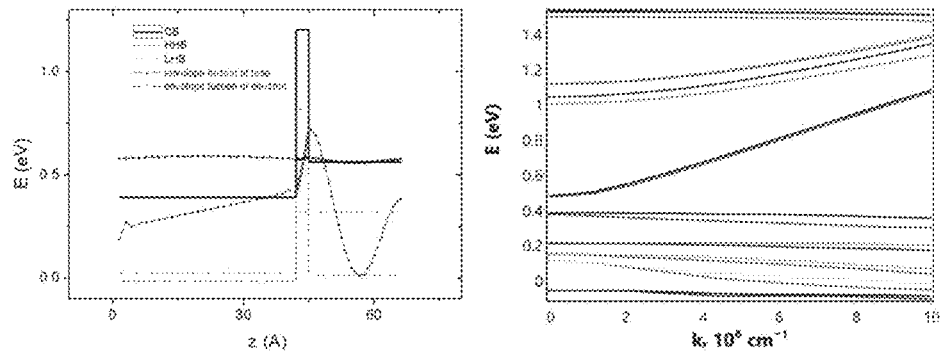
FIG. 4 illustrates the band alignment of one example InAs/InGaAsSb superlattice with InSb interface together with the envelope functions of electron and hole.

Due to the narrow bandgap nature of InGaAsSb, the Gallium content can be further reduced to reach a long wavelength range as indicated in FIG. 4. The Gallium related minority carrier lifetime problem is then reduced.

Figure 5:
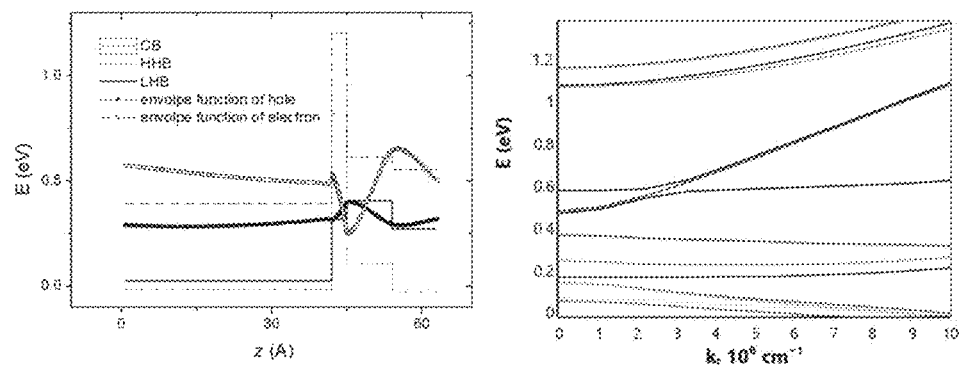
FIG. 5 illustrates the band alignment of another InAs/InGaAsSb superlattice with InSb interface together with the envelope functions of electron and hole.

Due to the adjustable bandgap, a structure with graded bandgap InGaAsSb in the InGaAsSb part can be designed. For example, the InGaAsSb has two contents and then two bandgap layers in the structure illustrated in FIG. 5. Each layer has 3 monolayers (with the same content) and the bandgap is graded by about 0.2 eV. With a bandgap graded InGaAsSb layer in each period of the superlattice, the envelope function of electron penetrates much more to the InGaAsSb layer. Then, the envelope functions of electron and hole have more overlap so that this structure has higher quantum efficiency than the traditional InAs/GaSb structure.

Figure 6:
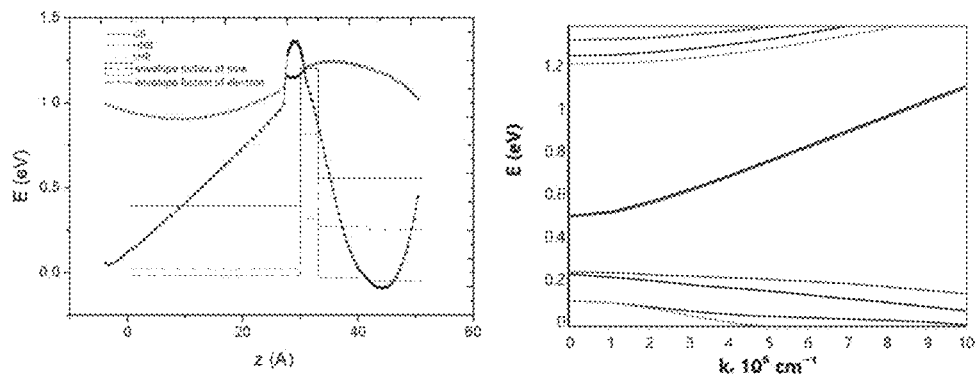
FIG. 6 illustrates the band alignment of still another InAs/InGaAsSb superlattice with InSb interface together with the envelope functions of electron and hole.

In another embodiment illustrated in FIG. 6, the bandgap of the graded InGaAsSb part can be configured so that the superlattice can reach middle wavelength infrared detection.

Figure 7:
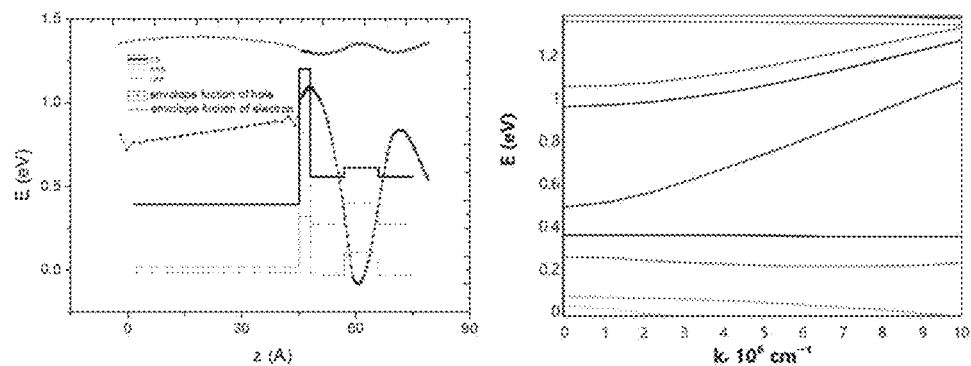
FIG. 7 illustrates the band alignment of still another InAs/InGaAsSb superlattice with InSb interface together with the envelope functions of electron and hole.
Figure 11:
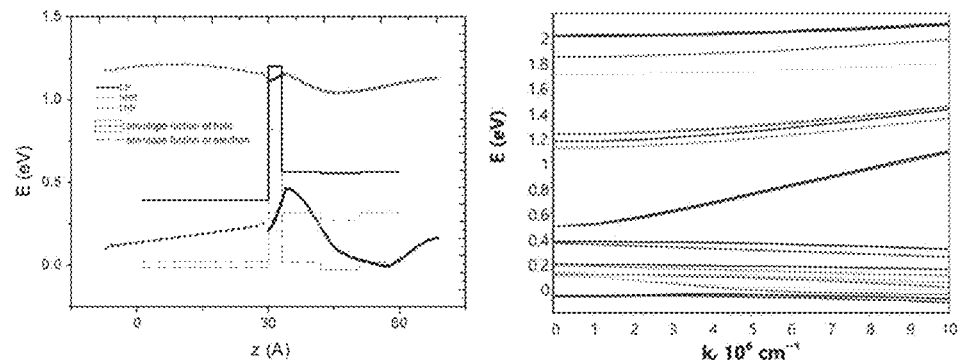
FIG. 11 illustrates the band alignment of still another InAs/InGaAsSb superlattice with InSb interface together with the envelope functions of electron and hole.

In the embodiments illustrated in FIG. 7 and FIG. 11, the InGaAsSb layer has three graded layers with two bandgaps. The detection wavelengths of these two structures are similar with the structure illustrate in FIG. 4 and FIG. 5, but the VBM and CBM position are different. Recent research shows the defect level in Type II superlattice absorber locates at a certain point in the forbidden miniband. With a graded InGaAsSb layer, it is possible to adjust the forbidden miniband position against the defect level to reduce the defect related recombination. Thus, the minority carrier lifetime is increased.

Figure 8:
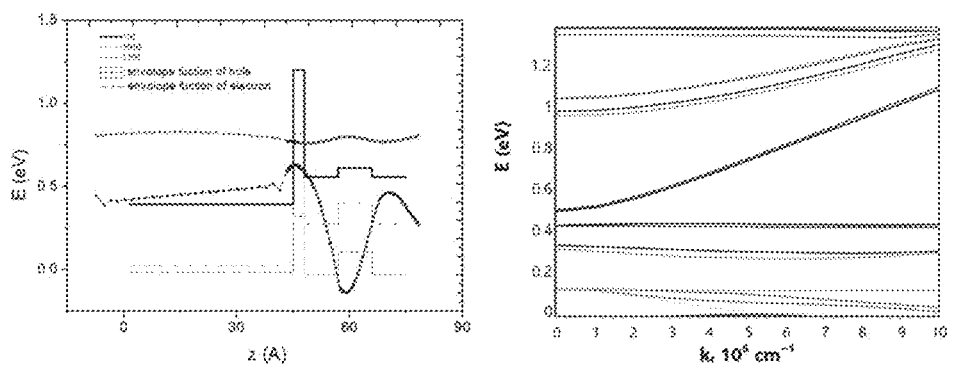
FIG. 8 illustrates the band alignment of still another InAs/InGaAsSb superlattice with InSb interface together with the envelope functions of electron and hole.
Figure 9:
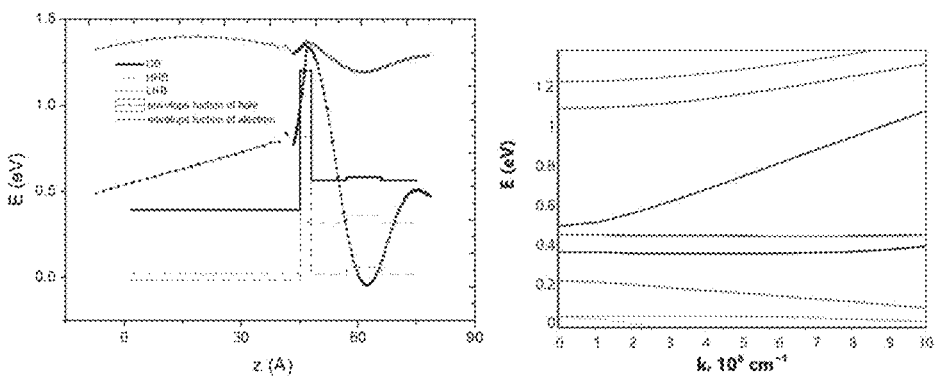
FIG. 9 illustrates the band alignment of still another InAs/InGaAsSb superlattice with InSb interface together with the envelope functions of electron and hole.
Figure 10:
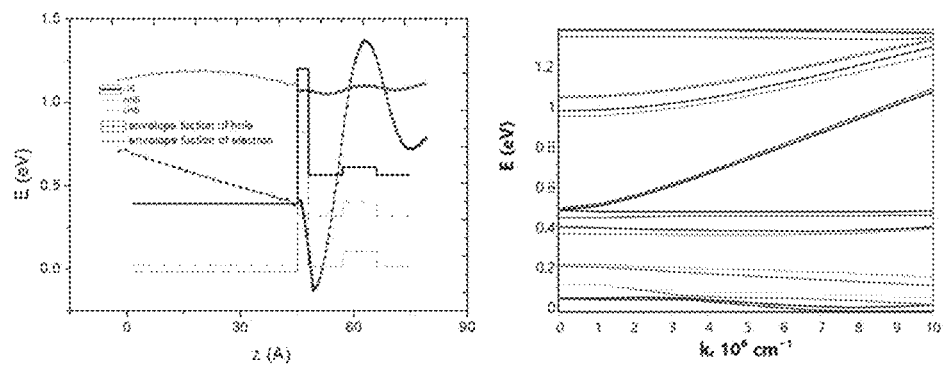
FIG. 10 illustrates the band alignment of still another InAs/InGaAsSb superlattice with InSb interface together with the envelope functions of electron and hole.

In traditional InAs/GaSb detector, the detection wavelength can be extended by changing the layer thickness of InAs and/or GaSb. Thus, the period thickness is also changed. Further effort needs to be paid to make strain balancing. Normally, the period thickness needs to be increased to get a longer detection wavelength so that the quantum efficiency is reduced. In the embodiment illustrated in FIGS. 8, 9 and 10 of this application, a longer detection wavelength and even semimetal range can be reached without changing the period thickness but the graded band alignment of the InGaAsSb layer.

The above embodiments illustrated in FIG. 4-FIG. 11 show some of the benefits this application could provide. Due to the very flexible material InGaAsSb, other properties of the superlattice such as electron effective mass and the like can be trimmed.

In an embodiment, the InGaAsSb layers have a flexible growth sequence to satisfy certain property requirements. For example, the InGaAsSb layers may include a structure of $InAs/In_{x-1}Ga_{1-x1}As_{y1}Sb_{1-y1}/In_{x2}Ga_{1-x2}As_{y2}Sb_{1-y2}/In_{x1}Ga_{1-x1}As_{y1}Sb_{1-y1}$, which can be changed to $InAs/In_{x2}Ga_{1-x2}As_{y2}Sb_{1-y2}/In_{x1}Ga_{1-x1}As_{y1}Sb_{1-y1}/In_{x2}Ga_{1-x2}As_{y2}Sb_{1-y2}$. In another example, the InGaAsSb layers may include a structure of $InAs/In_{x1}Ga_{1-x1}As_{y1}Sb_{1-y1}/$ $In_{x2}Ga_{1-x2}As_{y2}Sb_{1-y2}/In_{x1}Ga_{1-x1}As_{y1}Sb_{1-y1}/In_{x2}Ga_{1-x2}As_{y2}Sb_{1-y2}$ with two content combinations and four layers.

Figure 12:
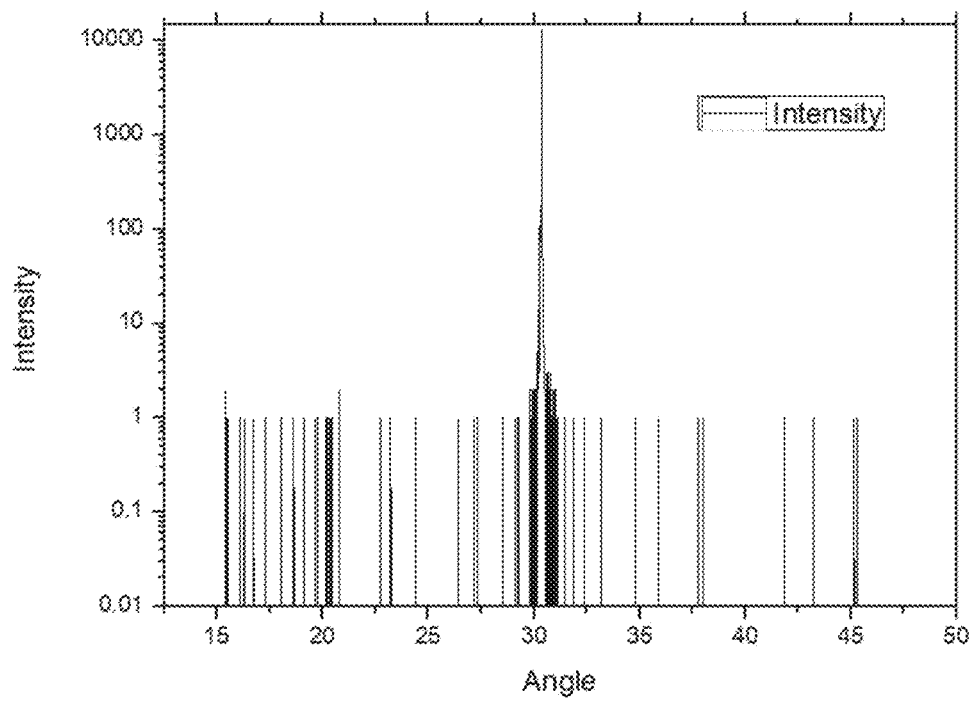
FIG. 12 illustrates an XRD rocking curve in a wide range of an InGaAsSb layer grown by MBE which shows there is no phase separation.
Figure 13:
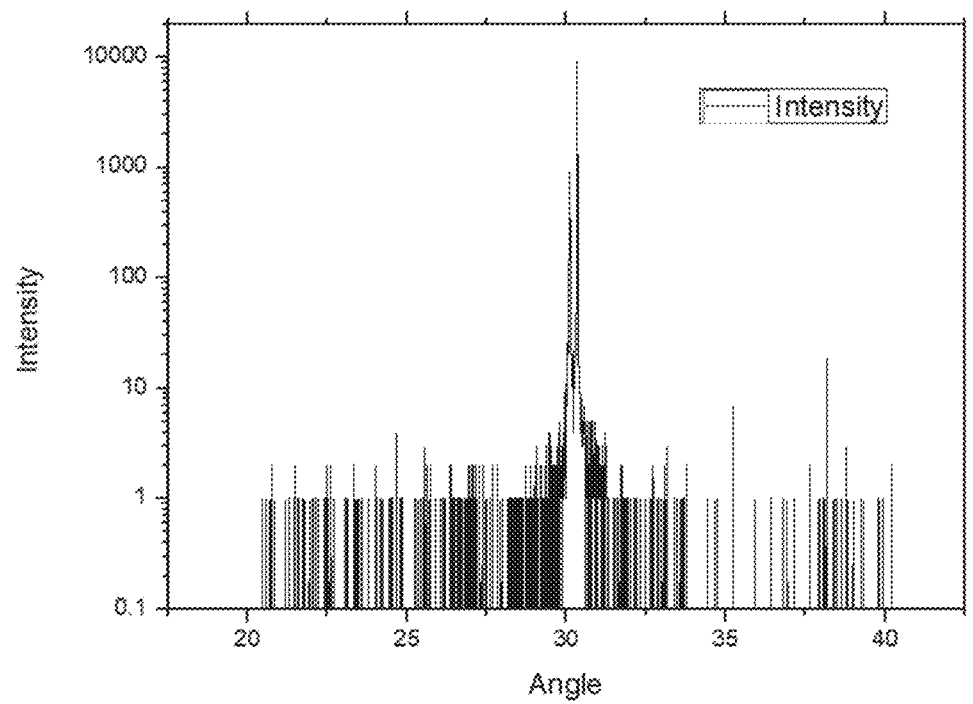
FIG. 13 illustrates an XRD rocking curve in a wide range of another InGaAsSb layer grown by MBE which shows there is no phase separation and different lattice constant from the layer illustrated in FIG. 12.
Figure 14:
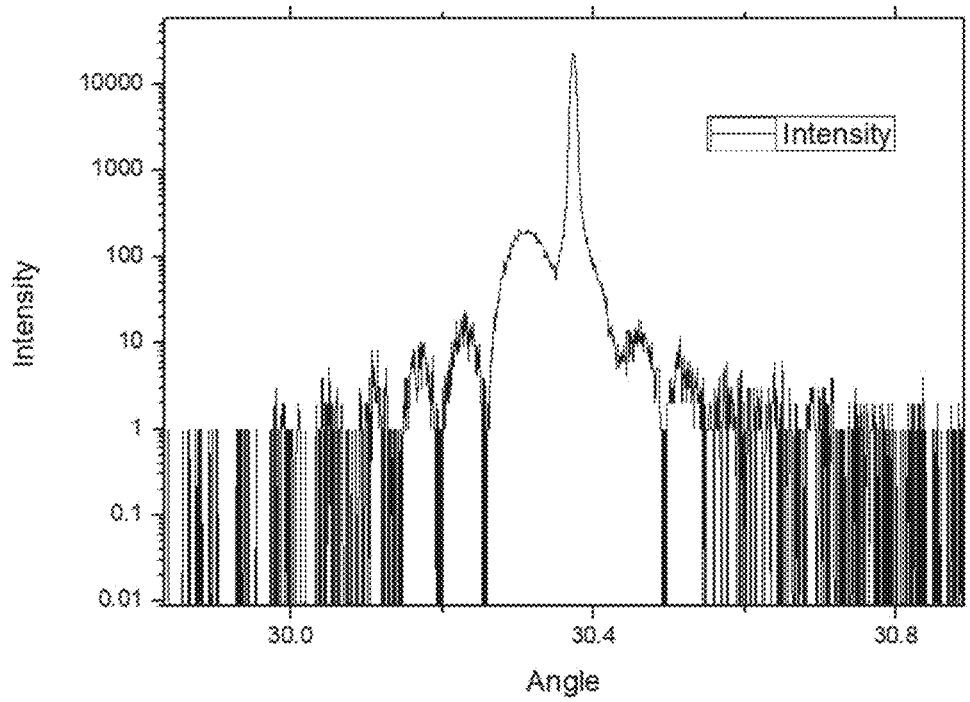
FIG. 14 illustrates an XRD rocking curve in a narrow range of the InGaAsSb layer same as the layer illustrated in FIG. 13. The high resolution scan shows fringes indicating a high quality of the epitaxy layer.
Figure 15:
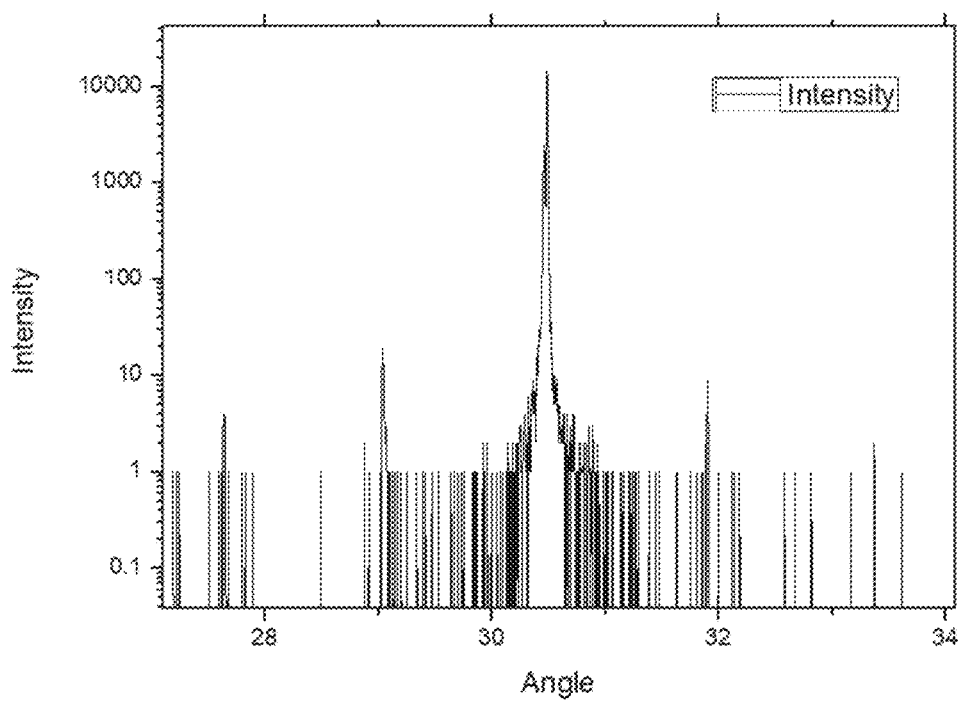
FIG. 15 illustrates an XRD rocking curve of a GaSb/InGaAsSb structure comprising 10 ML GaSb and 2 ML InGaAsSb. The clear satellite peak shows the high quality superlattice growth.

In practice, high quality phase pure InGaAsSb has been got by MBE (FIGS. 12-14). An special designed MBE system was used to get accurate control of As and Sb flux so that the InGaAsSb layer can be graded in even sub monolayer level. The structure illustrated in FIG. 15 has only two monolayers of InGaAsSb and the content was controlled at sub-monolayer level. The structure has only 50 periods but good XRD satellite peak and FWHM value indicating a very high quality of the superlattice structure.

Figure 16:
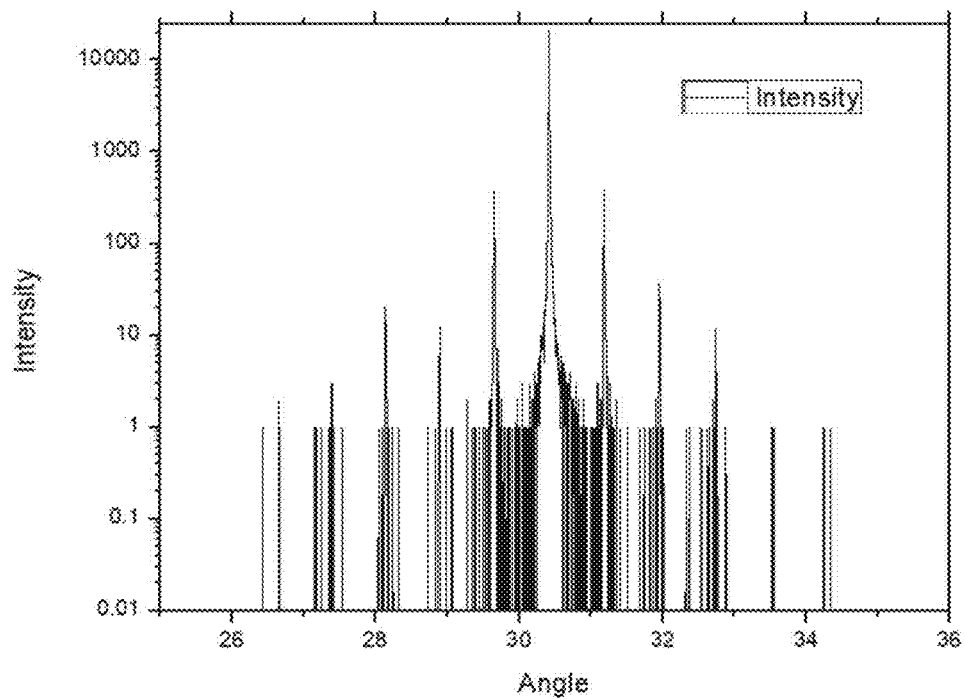
FIG. 16 illustrates an XRD rocking curve of an InAs/InGaAsSb structure comprising 13 ML GaSb and 7 ML InGaAsSb. The clear satellite peak shows the high quality superlattice growth.
Figure 17:
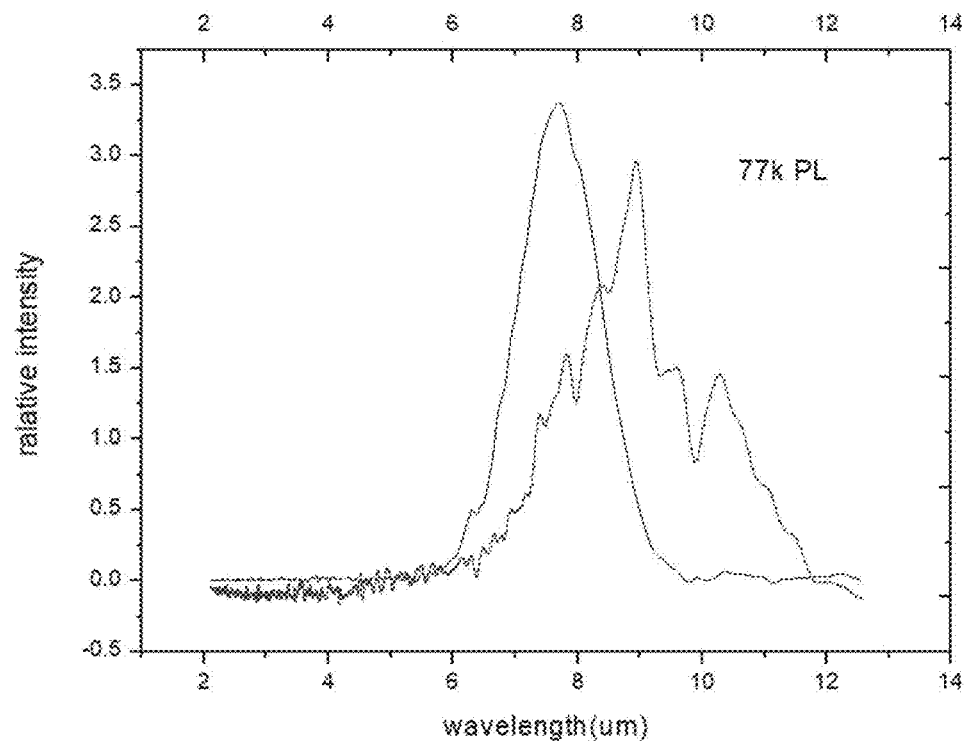
FIG. 17 illustrates two photoluminescence spectrums measured at 77k. The one having a peak at 7.7 μm was taken with a sample with no graded InGaAsSb layer of a InAs/InGaAsSb superlattice. And, the one having a peak at 9 μm was taken with a sample with graded InGaAsSb layer of a InAs/InGaAsSb superlattice The figures will be described in details in the following detailed of description of the invention.

FIG. 16 shows an InAs/InGaAsSb superlattice in practice level for an infrared detector with 13 ML of InAs and 7 ML InGaAsSb. The content of InGaAsSb was controlled at sub-monolayer level. The strain still needs to be balanced but the XRD still indicates a high quality of the structure. The photoluminescence spectrums taken at 77k in FIG. 17 show two embodiments of the structure that can reach 7 µm-9 µm detection wavelength.

The absorber can be integrated in a standard PIN detector or a unipolar barrier detector. With enhanced quantum efficiency and longer carrier lifetime of the absorber, the detector can achieve higher performance.

From what mentioned above, the superlattice detector with multiple InGaAsSb layer may includes a superlattice structure having two parts and interfaces between the two parts in each period. One of the parts is InAs, InGaAs or InAsSb, and the other parts is InGaAsSb. The InGaAsSb parts comprises several layers. The InGaAsSb layers have at least two different content of Indium and/or Arsenic. The above mentioned each layer has one to a few monolayers of InGaAsSb.

The InGaAsSb part and the InAs, InGaAs or InAsSb part are thin enough (0-20 nm) so that they are coupled effectively to create miniband. The band gap of the miniband of the superlattice depend on the thickness of each part, the Indium and/or Arsenic contents of InGaAsSb and the growth sequence of these different content InGaAsSb layers. The band gap of the miniband also depend on the Indium content in InGaAs part or Arsenic content in the InAsSb part in the case another part beside InGaAsSb to form the superlattice is InGaAs or InAsSb.

Furthermore, the InGaAsSb part have several layers which have at least two different contents. Each part may have 1-70 monolayers.

Furthermore, the growth sequence of these layers can be flexible. For example, a embodiment that has $InAs/In_{x1}Ga_{1-x1}As_{y1}Sb_{1-y1}/In_{x2}Ga_{1-x2}As_{y2}Sb_{1-y2}/In_{x1}Ga_{1-x1}As_{y1}Sb_{1-y1}$ can be changed to $InAs/In_{x2}Ga_{1-x2}As_{y2}Sb_{1-y2}/In_{x1}Ga_{1-x1}As_{y1}Sb_{1-y1}/In_{x2}Ga_{1-x2}As_{y2}Sb_{1-y2}$.

Furthermore, the interface between the InGaAsSb layer and the InAs, InGaAs or InAsSb layer can be configurated to InSb-like, GaAs-like or mixed to make strain compensation to the whole structure.

Furthermore, the superlattice absorber can be p-doped, n-doped or partly p-doped and partly n-doped. The absorber then is integrated with other functional layers to make a PIN detector, PIN detector with barrier or a unipolar detector.

Limited embodiments of this application have been illustrated here, but it should be noticed that the present application is capable of use in various other environments.

What is claimed is:

1. A superlattice absorber for a detector, the superlattice absorber comprising a plurality of material periods deposited successively, each of the material periods comprising:
    a first layer of InAs, InGaAs, InAsSb or InGaAsSb; and
    a plurality of second layers of InGaAsSb,
        wherein the second layers comprise at least two InGaAsSb layers with at least two different content combinations, and the content of the second layers is different from that of the first layer, and
        wherein each of the second layers comprises a $In_xGa_{1-x}As_ySb_{1-y}$ monolayer.

2. The superlattice absorber according to claim 1, wherein the second layers with different content combinations comprise different Indium contents and/or Arsenic contents from each other.

3. The superlattice absorber according to claim 1, wherein the second layers comprise a structure of
    $InAs/In_{x1}Ga_{1-x1}As_{y1}Sb_{1-y1}/In_{x2}Ga_{1-x2}As_{y2}Sb_{1-y2}/In_{x1}Ga_{1-x1}As_{y1}Sb_{1-y1}$ or
    $InAs/In_{x2}Ga_{1-x2}As_{y2}Sb_{1-y2}/In_{x1}Ga_{1-x1}As_{y1}Sb_{1-y1}/In_{x2}Ga_{1-x2}As_{y2}Sb_{1-y2}$.

4. The superlattice absorber according to claim 1, wherein the second layers comprise a structure of
    $InAs/In_{x1}Ga_{1-x1}As_{y1}Sb_{1-y1}/In_{x2}Ga_{1-x2}As_{y2}Sb_{1-y2}/In_{x1}Ga_{1-x1}As_{y1}Sb_{1-y1}/In_{x2}Ga_{1-x2}As_{y2}Sb_{1-y2}$ with two content combinations and four layers.

5. The superlattice absorber according to claim 1, wherein a thickness of each of the first layer and the second layers is less than or equal to 20 nm so that the first layer and the second layers are coupled effectively to create miniband.

6. The superlattice absorber according to claim 1, wherein the second layers are configured to be graded in a sub monolayer level so that the contents of the second layers are controlled at the sub monolayer level.

7. The superlattice absorber according to claim 1, wherein each of the material periods further comprises an interface between the first layer and the plurality of second layers, and the interface is configured to be InSb-like, GaAs-like or mixed to make strain compensation to the superlattice absorber.

8. The superlattice absorber according to claim 1, wherein each of the second layers has 1-70 $In_xGa_{1-x}As_ySb_{1-y}$ monolayers.

9. The superlattice absorber according to claim 1, wherein the superlattice absorber is doped to n-type conductivity, p-type conductivity, or partly n-type conductivity and partly p-type conductivity.

10. An infrared, PIN, or unipolar detector comprising the superlattice absorber according to claim 1.

11. The detector according to claim 10, further comprising a substrate of GaSb or InAs.

12. The detector according to claim 10, further comprising a barrier layer, an etch stop layer, and/or contact layers.

* * * * *